(12) United States Patent
Liu et al.

(10) Patent No.: US 12,295,197 B2
(45) Date of Patent: May 6, 2025

(54) DISPLAY SUBSTRATE, MANUFACTURING METHOD THEREOF AND DISPLAY PANEL

(71) Applicant: BOE TECHNOLOGY GROUP CO., LTD., Beijing (CN)

(72) Inventors: Yang Liu, Beijing (CN); Zhengyin Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 566 days.

(21) Appl. No.: 17/762,049

(22) PCT Filed: May 7, 2021

(86) PCT No.: PCT/CN2021/092079
§ 371 (c)(1),
(2) Date: Mar. 18, 2022

(87) PCT Pub. No.: WO2021/233130
PCT Pub. Date: Nov. 25, 2021

(65) Prior Publication Data
US 2022/0416189 A1    Dec. 29, 2022

(30) Foreign Application Priority Data

May 22, 2020   (CN) .......................... 202010441011.9

(51) Int. Cl.
*H10K 50/11*    (2023.01)
*H10K 59/35*    (2023.01)
(Continued)

(52) U.S. Cl.
CPC ............. *H10K 50/11* (2023.02); *H10K 59/35* (2023.02); *H10K 71/00* (2023.02); *H10K 2102/351* (2023.02)

(58) Field of Classification Search
CPC ............................... H10K 50/11; H10K 50/13
See application file for complete search history.

(56) References Cited

U.S. PATENT DOCUMENTS

2006/0091794 A1    5/2006 Agostinelli et al.
2011/0121320 A1    5/2011 Pieh et al.
(Continued)

FOREIGN PATENT DOCUMENTS

CN            102074656 A        5/2011
CN            103518268 A        1/2014
(Continued)

OTHER PUBLICATIONS

China Patent Office, First Office Action, Oct. 11, 2021, Chinese application No. 202010441011.9.

*Primary Examiner* — Erik Kielin
(74) *Attorney, Agent, or Firm* — HOUTTEMAN LAW LLC (57) ABSTRACT

The present disclosure provides a display substrate, a manufacturing method thereof and a display panel. The display substrate includes a base substrate and a plurality of sub-pixels of different colors on the base substrate, wherein the plurality of sub-pixels include green sub-pixels, each of which includes an anode, a luminescent layer, and a cathode sequentially stacked in a direction away from the base substrate. The luminescent layer includes a first sub-layer, a second sub-layer and a third sub-layer sequentially stacked in the direction away from the base substrate; a molar ratio of P-type molecules to N-type molecules in a host material of the first sub-layer is greater than that of the second sub-layer, which in turn is greater than that of the third sub-layer.

20 Claims, 4 Drawing Sheets

(51) Int. Cl.
*H10K 71/00* (2023.01)
*H10K 102/00* (2023.01)

(56) References Cited

U.S. PATENT DOCUMENTS

| | | |
|---|---|---|
| 2012/0248421 A1 | 10/2012 | Yamazaki et al. |
| 2014/0084274 A1* | 3/2014 | Yamazaki .............. H10K 50/11 257/40 |
| 2017/0104171 A1* | 4/2017 | Chen ...................... H10K 50/11 |
| 2017/0222171 A1 | 8/2017 | Tianma et al. |
| 2020/0258949 A1 | 8/2020 | Li et al. |
| 2022/0158111 A1* | 5/2022 | Mizusaki ............. H10K 50/156 |

FOREIGN PATENT DOCUMENTS

| | | |
|---|---|---|
| CN | 105098086 A | 11/2015 |
| CN | 105552184 A | 5/2016 |
| CN | 105845834 A | 8/2016 |
| CN | 106654033 A | 5/2017 |
| CN | 106960862 A | 7/2017 |
| CN | 110148677 A | 8/2019 |
| CN | 110635061 A | 12/2019 |
| CN | 111584728 A | 8/2020 |

* cited by examiner

|  | Temperature (°C) | Lighting voltage (V) | Efficiency (cd/A) |
|---|---|---|---|
| Green light-emitting element in the related art | -10 | 4.2 | 68 |
|  | 20 | 3.8 | 62 |
|  | 50 | 3.6 | 56 |
| Green light-emitting element of the present disclosure | -10 | 3.8 | 66 |
|  | 20 | 3.6 | 63 |
|  | 50 | 3.5 | 61 |

DISPLAY SUBSTRATE, MANUFACTURING METHOD THEREOF AND DISPLAY PANEL

CROSS REFERENCE TO RELATED APPLICATIONS

The present application claims the priority of the Chinese Patent Application No. 202010441011.9 filed on May 22, 2020, the content of which is incorporated herein by reference in its entirety.

TECHNICAL FIELD

The present disclosure relates to the field of display technology, and in particular to a display substrate, a manufacturing method thereof and a display panel.

BACKGROUND

Organic Light-Emitting diodes (OLEDs) have unique excellent characteristics such as self-luminescence, wide color gamut, fast response, thin panel, bendable characteristics, and low temperature resistance, and therefore have been widely used for panel displays such as a mobile phone, a vehicle display, and a camera, and are intended to replace conventional liquid crystal displays, and become the accepted next-generation screen display technology.

SUMMARY

The present disclosure provides a display substrate, a manufacturing method thereof and a display panel.

In one aspect, the present disclosure provides a display substrate, including a base substrate and a plurality of sub-pixels of different colors on the base substrate, wherein the plurality of sub-pixels include green sub-pixels, each of which includes an anode, a luminescent layer, and a cathode, the anode, the luminescent layer and the cathode are sequentially stacked in a direction away from the base substrate, and the luminescent layer includes a first sub-layer, a second sub-layer and a third sub-layer sequentially stacked in the direction away from the base substrate; each of the first sub-layer, the second sub-layer and the third sub-layer includes a host material; a molar ratio of P-type molecules to N-type molecules in the host material of the first sub-layer is greater than that of the second sub-layer, which in turn is greater than that of the third sub-layer.

In one embodiment, the molar ratio of P-type molecules to N-type molecules in the host material of the first sub-layer is greater than 1 and less than 9.

In one embodiment, the molar ratio of P-type molecules to N-type molecules in the host material of the third sub-layer is greater than 1/9 and less than 1.

In one embodiment, the molar ratio of P-type molecules to N-type molecules in the host material of the second sub-layer is greater than 1/2 and less than 2.

In one embodiment, the first sub-layer has a thickness in a range 10 nm to 15 nm; the second sub-layer has a thickness in a range 10 nm to 15 nm; and the third sub-layer has a thickness in a range 10 nm to 15 nm.

In one embodiment, each of the first sub-layer, the second sub-layer and the third sub-layer includes a guest material; and guest materials in the first sub-layer, the second sub-layer and the third sub-layer have the same doping proportion.

In one embodiment, the doping proportion of the guest material in the first sub-layer is in a range from 5% to 10%; the doping proportion of the guest material in the second sub-layer is in a range from 5 to 10%; and the doping proportion of the guest material in the third sub-layer is in a range from 5% to 10%.

In one embodiment, the green sub-pixel further includes a hole transport layer on a side of the first sub-layer close to the anode, and an electron transport layer on a side of the third sub-layer close to the cathode.

In one embodiment, the hole transport layer includes a first hole transport sub-layer and a second hole transport sub-layer sequentially stacked in the direction away from the base substrate, and a highest occupied molecular orbital energy level of the second hole transport sub-layer is between a highest occupied molecular orbital energy level of the first hole transport sub-layer and a highest occupied molecular orbital energy level of the luminescent layer; and the electron transport layer includes a first electron transport sub-layer and a second electron transport sub-layer sequentially stacked in the direction away from the base substrate, and a lowest unoccupied molecular orbital energy level of the first electron transport sub-layer is between a lowest unoccupied molecular orbital energy level of the second electron transport sub-layer and a lowest unoccupied molecular orbital energy level of the luminescent layer.

In one embodiment, the green sub-pixel further includes a hole injection layer on a side of the hole transport layer close to the anode and an electron injection layer on a side of the electron transport layer close to the cathode.

In one embodiment, the plurality of sub-pixels further includes red sub-pixels and blue sub-pixels, and the red sub-pixels, the blue sub-pixels, and the green sub-pixels are arranged in an array.

In another aspect, the present disclosure provides a display panel including the display substrate described herein or manufactured by the method described herein.

In another aspect, the present disclosure provides a method for manufacturing a display substrate, including steps of: forming a plurality of sub-pixels of different colors on a base substrate, wherein the forming the plurality of sub-pixels includes forming a green sub-pixel, which includes forming an anode, a luminescent layer, and a cathode which are sequentially stacked in a direction away from the base substrate, wherein the forming a luminescent layer comprises sequentially forming a first sub-layer, a second sub-layer and a third sub-layer which are sequentially stacked in the direction away from the base substrate; each of the first sub-layer, the second sub-layer and the third sub-layer comprises a host material; a molar ratio of P-type molecules to N-type molecules in the host material of the first sub-layer is greater than that of the second sub-layer, which in turn is greater than that of the third sub-layer.

In one embodiment, the first sub-layer, the second sub-layer, and the third sub-layer are sequentially formed through an evaporation process.

BRIEF DESCRIPTION OF DRAWINGS

Reference signs are:
1. a base substrate; 2. a green sub-pixel; 21. an anode; 22. a luminescent layer; 220. a first sub-layer; 221. a second sub-layer; 222. a third sub-layer; 23. a cathode; 24. a hole transport layer; 241. a first hole transport sub-layer; 242. a second hole transport sub-layer; 25. an electron transport layer; 251. a first electron transport sub-layer; 252. a second electron transport sub-layer; 26. a hole injection layer; 27. an electron injection layer.

DETAIL DESCRIPTION OF EMBODIMENTS

In order to enable one of ordinary skill in the art to better understand the technical solution of the present disclosure, a display substrate, a manufacturing method thereof, and a display panel of the present disclosure are further described in detail below with reference to the accompanying drawings and the detailed description.

A red (R), a green (G) and a blue (B) light-emitting elements in an OLED device have different changes in luminous efficiency with temperature. In particular, the luminous efficiency of the green light-emitting element decreases significantly with an increase in temperature. For example, the luminous efficiency of the green light-emitting element decreases by 20% as the temperature increases from −20° C. to 80° C. The red light-emitting element and the blue light-emitting element each have smaller changes in the efficiency with the temperature than the green light-emitting element. The green light has the greatest contribution to brightness (60% to 75%), which results in a higher efficiency of the green light-emitting element at low temperatures and a lower efficiency of the green light-emitting element at high temperatures, and thus, the white balance of an OLED screen is unbalanced, so that the OLED screen emits light which is a little greener at low temperatures and a little redder at high temperatures.

In a phosphorescent OLED display device, a size of an exciton recombination region affects the luminous efficiency. Specifically, the larger the exciton recombination region is in size, the lower an exciton concentration is, so that the luminous efficiency may be improved; the smaller the exciton recombination region is in size, the higher the exciton concentration is, so that the triplet exciton annihilation occurs more easily, resulting in a decrease in efficiency.

Figure 1:
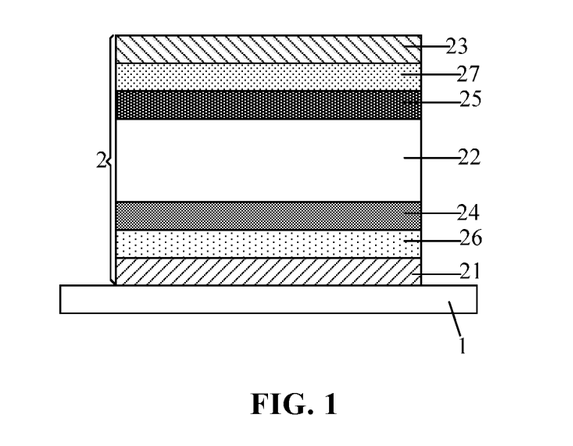
FIG. 1 is a schematic cross-sectional view of a structure of a green light-emitting element of an OLED display device in the related art.

FIG. 1 is a schematic cross-sectional view of a structure of a green light-emitting element of an OLED display device in the related art. As shown in FIG. 1, a green light-emitting element in a phosphorescent OLED display device has a luminescent layer 22 which is a single layer, and a green host (GH) material of the luminescent layer 22 has a molar ratio of P-type molecules to N-type molecules which is generally 5:5. For the green light-emitting element in the phosphorescent OLED display device, as the temperature increases, an exciton recombination region moves towards a hole transport layer, so that the exciton recombination region is narrowed, the probability of triplet exciton annihilation is enhanced, and the device efficiency is reduced; as the temperature decreases, the exciton recombination region moves towards an electron transport layer, so that the exciton recombination region is widened, the probability of triplet exciton annihilation is reduced, and the device efficiency is improved, which results in a higher efficiency of the green light-emitting element at low temperatures and a lower efficiency of the green light-emitting element at high temperatures, and therefore, the white balance of an OLED screen is unbalanced, so that the OLED screen emits light which is a little greener at low temperatures and a little redder at high temperatures.

In embodiments of the present disclosure, the host material is a pre-mixed material, including a hole-type material and an electron-type material.

In view of the above problems, embodiments of the present disclosure provide a display substrate.

Figure 2:
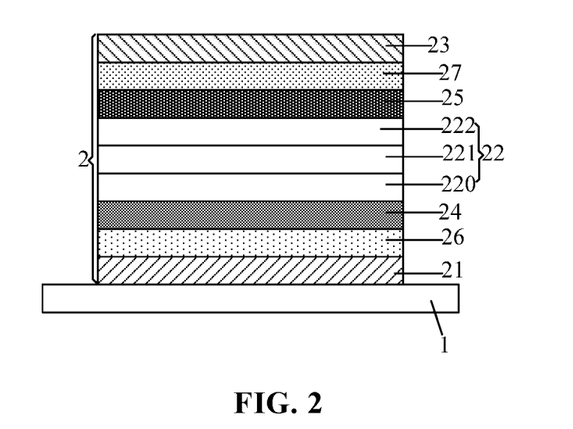
FIG. 2 is a schematic cross-sectional view of a structure of a green sub-pixel in a display substrate according to an embodiment of the present disclosure.

FIG. 2 is a schematic cross-sectional view of a structure of a green sub-pixel in a display substrate according to an embodiment of the present disclosure. As shown in FIG. 2, the display substrate includes a base substrate 1 and a plurality of sub-pixels of different colors disposed on the base substrate 1. Only one sub-pixel, i.e., a green sub-pixel 2, is exemplarily shown in FIG. 2. The green sub-pixel 2 includes an anode 21, a luminescent layer 22, and a cathode 23, which are sequentially stacked in a direction away from the base substrate 1; the luminescent layer 22 includes a first sub-layer 220, a second sub-layer 221, and a third sub-layer 222, which are sequentially stacked in the direction away from the base substrate 1; molar ratios of P-type molecules to N-type molecules in host materials of the first sub-layer 220, the second sub-layer 221, and the third sub-layer 222 sequentially decrease. That is, a molar ratio of P-type molecules to N-type molecules in the host material of the first sub-layer 220 is greater than that of the second sub-layer 221, which in turn is greater than that of the third sub-layer 222.

The green sub-pixel 2 is a green light-emitting element. P-type molecules are used to transport holes and N-type molecules are used to transport electrons.

In this embodiment, the green sub-pixel 2 further includes a hole transport layer 24 disposed on a side of the first sub-layer 220 close to the anode 21 and an electron transport layer 25 disposed on a side of the third sub-layer 222 close to the cathode 23. The hole transport layer 24 is used for transporting holes and blocking electrons; and the electron transport layer 25 is used for transporting electrons and blocking holes.

For the above luminescent layer 22, when the temperature increases, the exciton recombination region of the green sub-pixel 2 moves towards the hole transport layer 24, so that the exciton recombination region is reduced in size; and the molar ratio of P-type molecules to N-type molecules in the host material of the first sub-layer 220 close to the hole transport layer 24 is set to be higher than that of the second sub-layer 221 located between the first sub-layer 220 and the third sub-layer 222. In this way, it is possible to improve hole mobility, suppress the motion of the exciton recombination region towards the hole transport layer 24, thereby reducing the tendency of the exciton recombination region to be reduced in size, and reducing the extent of decrease in efficiency of the green light-emitting element. When the temperature decreases, the exciton recombination region of the green sub-pixel 2 moves towards the electron transport layer 25, so that the exciton recombination region is increased in size; and the molar ratio of P-type molecules to N-type molecules in the host material of the third sub-layer 222 close to the electron transport layer 25 is set to be lower than that of the second sub-layer 221 located between the first sub-layer 220 and the third sub-layer 222. In this way, it is possible to reduce hole mobility, suppress the motion of the exciton recombination region towards the electron transport layer 25, thereby reducing the tendency of the exciton recombination region to be increased in size, and reducing the extent of increase in efficiency of the green light-emitting element.

The display substrate generally mitigates the problem of color deviation caused by an increase in efficiency of the green light-emitting element at low temperatures and a decrease in efficiency of the green light-emitting element at high temperatures, thereby mitigating the problem that the light-emitting element emits light which is a little greener at low temperatures and a little redder at high temperatures, and further mitigating the problem that the display substrate emits light which is a little greener at low temperatures and a little redder at high temperatures during the display.

In this embodiment, the molar ratio of P-type molecules to N-type molecules in the host material of the first sub-layer 220 is greater than 1 and less than 9. As the temperature increases, the exciton recombination region of the green light-emitting element moves towards the hole transport layer 24 (an extent of an increase in the hole mobility is smaller than an extent of an increase in the electron mobility). The molar ratio of P-type molecules to N-type molecules in the host material of the first sub-layer 220 close to the hole transport layer 24 is set to be greater than 1 and less than 9, such that the hole mobility is increased. In this way, as the temperature increases, it is possible to prevent the exciton recombination region from moving towards the hole transport layer 24, and therefore reduce the tendency of the exciton recombination region to be narrowed, and reduce the probability of the triplet exciton annihilation, thereby reducing the extent of decrease in the efficiency of the green light-emitting element.

In this embodiment, the molar ratio of P-type molecules to N-type molecules in the host material of the third sub-layer 222 is greater than 1/9 and less than 1. As the temperature decreases, the exciton recombination region of the green light-emitting element moves towards the electron transport layer 25 (an extent of an increase in the electron mobility is smaller than an extent of an increase in the hole mobility). The molar ratio of P-type molecules to N-type molecules in the host material of the third sub-layer 222 close to the electron transport layer 25 is greater than 1/9 and less than 1, such that the hole mobility is decreased. In this way, as the temperature decreases, it is possible to prevent the exciton recombination region from moving towards the electron transport layer 25, and therefore reduce the extent of the exciton recombination region to be widened, thereby reducing the extent of increase in the efficiency of the green light-emitting element.

In this embodiment, the molar ratio of P-type molecules to N-type molecules in the host material of the second sub-layer 221 is greater than 1/2 and less than 2, which may facilitate mitigating the problem that the light-emitting element emits light which is a little greener at low temperatures and a little redder at high temperatures.

In this embodiment, a thickness of the first sub-layer 220 is in a range from 10 nm to 15 nm; a thickness of the second sub-layer 221 is in a range from 10 nm to 15 nm; a thickness of the third sub-layer 222 is in a range from 10 nm to 15 nm.

In this embodiment, doping proportions of guest materials in the first sub-layer 220, the second sub-layer 221 and the third sub-layer 222 are the same. Specifically, the doping proportion of the guest material in the first sub-layer 220 is in a range from 5% to 10%; the doping proportion of the guest material in the second sub-layer 221 is in a range from 5% to 10%; the doping proportion of the guest material in the third sub-layer 222 is in a range from 5% to 10%. For example, each of the doping proportions of the guest materials in the first sub-layer 220, the second sub-layer 221 and the third sub-layer 222 is 8%.

In this embodiment, the green sub-pixel 2 further includes a hole injection layer 26 on a side of the hole transport layer 24 close to the anode 21, and an electron injection layer 27 on a side of the electron transport layer 25 close to the cathode 23.

Figure 3A:
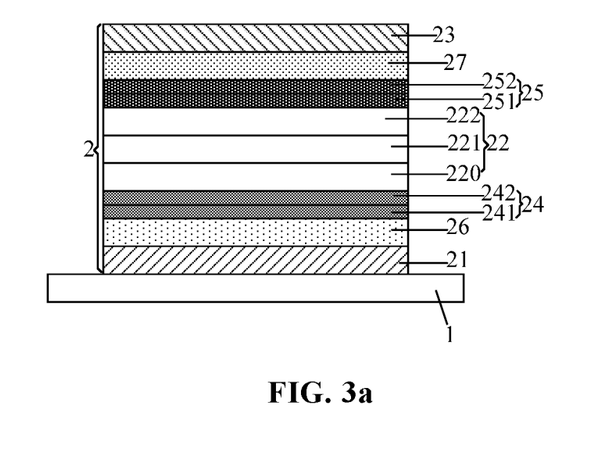
FIG. 3a is a schematic cross-sectional view of a structure of a green sub-pixel in a display substrate according to an embodiment of the present disclosure.

FIG. 3a is a schematic cross-sectional view of a structure of a green sub-pixel in a display substrate according to an embodiment of the present disclosure. In the present embodiment, as shown in FIG. 3a, the hole transport layer 24 includes a first hole transport sub-layer 241 and a second hole transport sub-layer 242, which are sequentially stacked in the direction away from the base substrate 1. In the present embodiment, as shown in FIG. 3a, the electron transport layer 25 includes a first electron transport sub-layer 251 and a second electron transport sub-layer 252, which are sequentially stacked in the direction away from the base substrate 1.

Figure 3B:
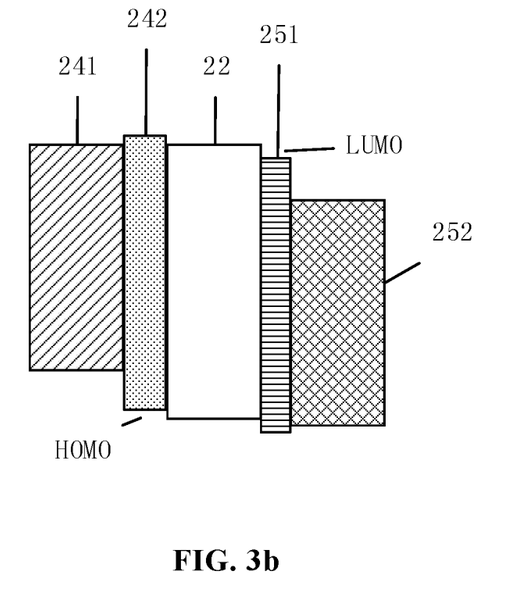
FIG. 3b is a schematic diagram of energy levels of a hole transport layer, a luminescent layer and an electron transport layer in a display substrate according to an embodiment of the present disclosure.

FIG. 3b is a schematic diagram of energy levels of a hole transport layer, a luminescent layer and an electron transport layer in a display substrate according to an embodiment of the present disclosure.

In the present embodiment, each of the hole transport layer 24 and the electron transport layer includes two sub-layers. That is, the hole transport layer 24 includes the first hole transport sub-layer 241 and the second hole transport sub-layer 242; the electron transport layer 25 includes the first electron transport sub-layer 251 and the second electron transport sub-layer 252. In this way, as shown in FIG. 3b, a Highest Occupied Molecular Orbital (HOMO) energy level and a Lowest Unoccupied Molecular Orbital (LUMO) energy level may be added for facilitating better transport of holes and electrons to the luminescent layer. In the present embodiment, a highest occupied molecular orbital energy level of the second hole transport sub-layer 242 is between a highest occupied molecular orbital energy level of the first hole transport sub-layer 241 and a highest occupied molecular orbital energy level of the luminescent layer 22. In the present embodiment, a lowest unoccupied molecular orbital energy level of the first electron transport sub-layer 251 is between a lowest unoccupied molecular orbital energy level of the second electron transport sub-layer 252 and a lowest unoccupied molecular orbital energy level of the luminescent layer 22.

Further, in the present embodiment, the second hole transport sub-layer 242 is also used to block leakage of electrons from the luminescent layer to the hole transport layer. Further, in the present embodiment, the first electron transport sub-layer 251 is also used to block leakage of holes from the luminescent layer to the electron transport layer.

In this embodiment, the green sub-pixel 2 further includes the hole injection layer 26 on a side of the hole transport layer 24 close to the anode 21, and the electron injection layer 27 on a side of the electron transport layer 25 close to the cathode 23.

In this embodiment, for example: firstly, the first sub-layer 220 with a thickness of 10 nm is formed on the hole transport layer 24 through an evaporation process, wherein the molar ratio of P-type molecules to N-type molecules in the host material of the first sub-layer 220 is 7:3, and the doping proportion of the guest material in the first sub-layer 220 is 8%; then, the second sub-layer 221 with a thickness of 10 nm is formed on the first sub-layer 220 through an evaporation process, wherein the molar ratio of P-type molecules to N-type molecules in the host material of the second sub-layer 221 is 5:5, and the doping proportion of the guest material in the second sub-layer 221 is 8%; finally, the third sub-layer 222 with a thickness of 15 nm is formed on the second sub-layer 221 through an evaporation process, wherein the molar ratio of P-type molecules to N-type molecules in the host material of the third sub-layer 222 is 3:7, and the doping proportion of the guest material in the third sub-layer 222 is 8%.

Figure 4:
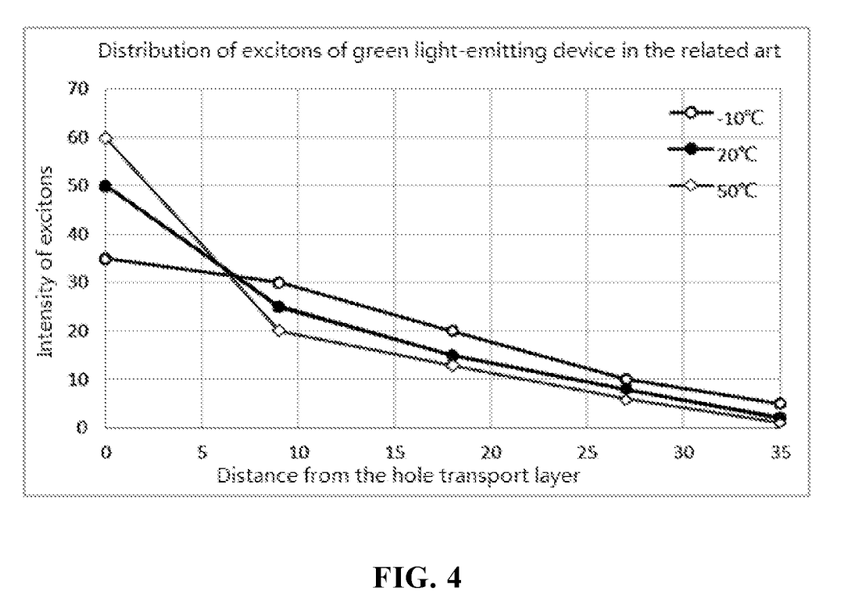
FIG. 4 is a schematic diagram illustrating a distribution of excitons of a green light-emitting element in the related art.
Figure 5:
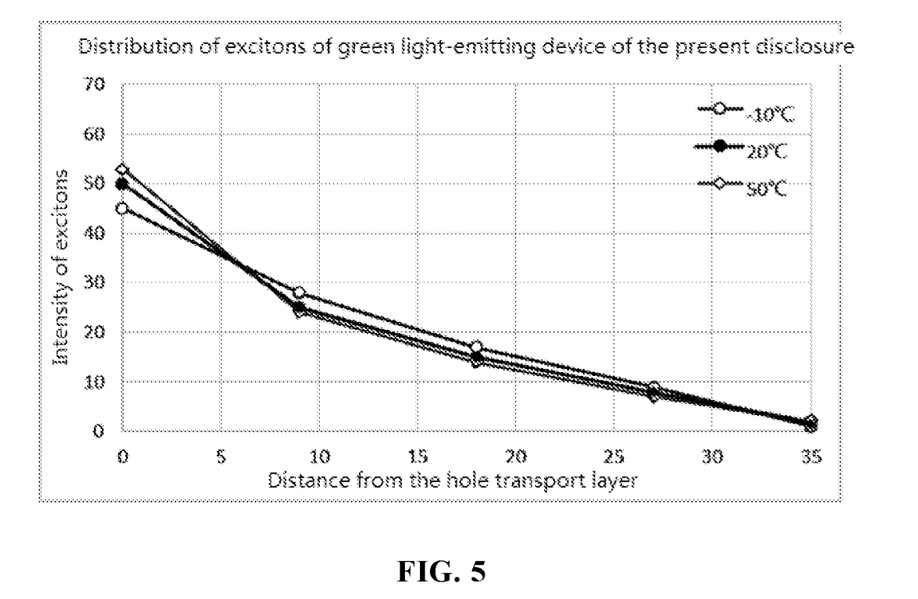
FIG. 5 is a schematic diagram illustrating a distribution of excitons of a green light-emitting element according to an embodiment of the present disclosure.
Figure 6:
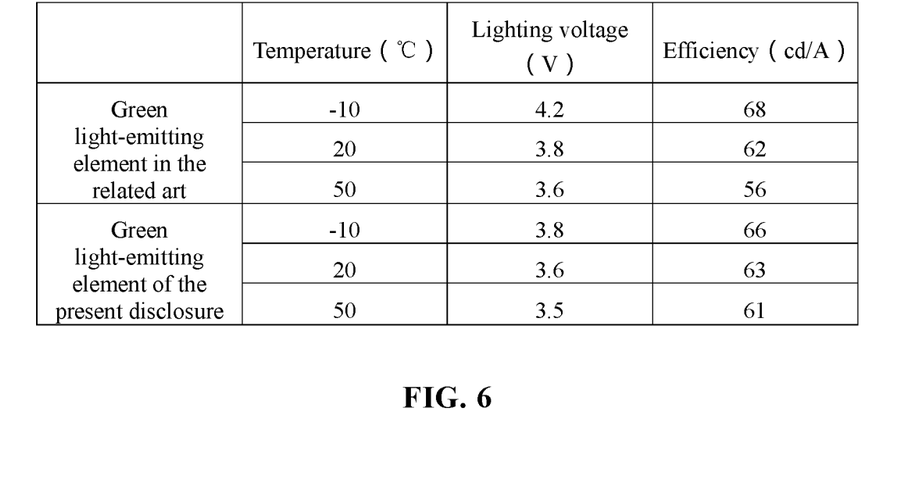
FIG. 6 shows lighting voltages and efficiency at different temperatures for a green light-emitting element according to an embodiment of the present disclosure and a green light-emitting element in the related art.
Figure 7:
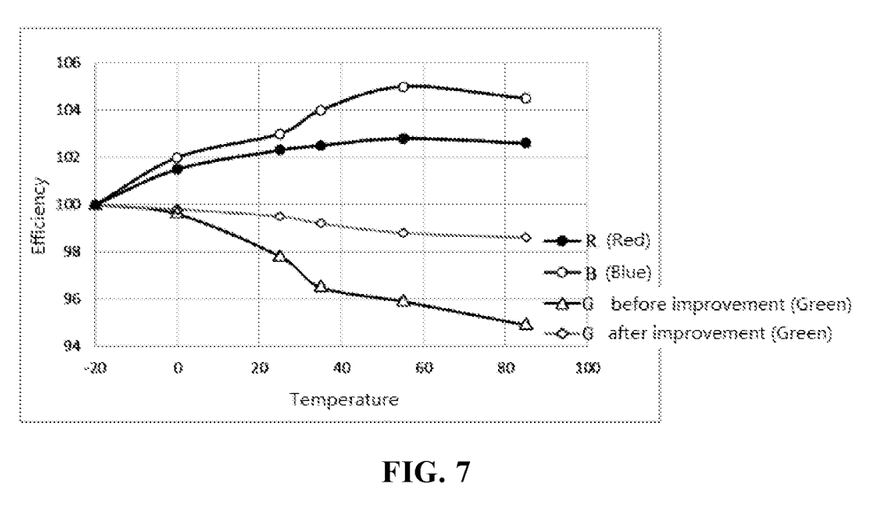
FIG. 7 is a graph of efficiency versus temperature for a green light-emitting element according to an embodiment of the present disclosure and a green light-emitting element in the related art.

FIG. 4 is a schematic diagram illustrating a distribution of excitons of a green light-emitting element in the related art; FIG. 5 is a schematic diagram illustrating a distribution of excitons of a green light-emitting element according to an embodiment of the present disclosure; FIG. 6 shows lighting voltages and efficiency at different temperatures for a green light-emitting element according to an embodiment of the present disclosure and a green light-emitting element in the related art; FIG. 7 is a graph of efficiency versus temperature for a green light-emitting element according to an embodiment of the present disclosure and a green light-emitting element in the related art.

Red insertion layers are respectively inserted at positions 0 nm, 9 nm, 18 nm, 27 nm and 35 nm from the hole transport layer 24 in each of the green light-emitting element in the related art and the green light-emitting element according to an embodiment of the present disclosure. The diagram illustrating the distribution of excitons is plotted according to the spectrum intensity. Experimental results of the distribution of the excitons and the change in efficiency, with the change of the temperature, of the green light-emitting element in the related art and the green light-emitting element according to an embodiment of the present disclosure are shown in FIGS. 4 to 7. As may be seen from FIGS. 4 to 7, with the change of the temperature, the distribution of the excitons of the green light-emitting element in the present embodiment is more concentrated than that of the green light-emitting element in the related art (as shown in FIGS. 4 and 5); and with the change of the temperature, the lighting voltage of the green light-emitting element in the present embodiment has a much smaller variation range than that of the green light-emitting element in the related art (as shown in FIG. 6), and the efficiency of the green light-emitting element in the present embodiment has a much smaller variation range than that of the green light-emitting element in the related art, and the efficiency of the green light-emitting element in the present embodiment has been significantly increased (as shown in FIGS. 6 and 7), thereby significantly mitigating the problem that the light-emitting element emits light which is a little greener at low temperatures and a little redder at high temperatures, and further mitigating the problem that the display substrate emits light which is a little greener at low temperatures and a little redder at high temperatures during the display.

In this embodiment, a red layer with a lower energy and a longer wavelength is used as the insertion layer for the green light-emitting element. For the green light-emitting element with the red insertion layer, peaks of green and red light of different wavelengths appear in the EL spectrum. The peak of green light is removed through data processing, and the intensity of the remaining peak of red light may reflect the intensity of excitons at a position in the green light-emitting element, and therefore can reflect the distribution of the excitons.

In this embodiment, the sub-pixels further include red sub-pixels and blue sub-pixels. The red sub-pixels, the blue sub-pixels and the green sub-pixels are arranged in an array. The red sub-pixel and the blue sub-pixel have smaller changes in the efficiency with the change of the temperature than the green sub-pixel, so that only the green sub-pixel is improved in the embodiment.

A blue host material (BH) of a luminescent layer of the currently mass-produced blue light-emitting element is a single-host material in which the molar ratio of P-type molecules to N-type molecules is constant. In addition, a red host material (RH) of the luminescent layer of the currently mass-produced red light-emitting element may be a single-host material or a pre-mixed material, but the red light-emitting element has a much smaller change in the efficiency with the change of the temperature than the green light-emitting element, so that it is not necessary to adjust the molar ratio of P-type molecules to N-type molecules of the host material of the red light-emitting element now.

In embodiments of the present disclosure, the disclosed structures and methods are applicable to green light-emitting elements. The present invention is not limited thereto, and the structures and methods disclosed in the embodiments of the present disclosure are also applicable to light-emitting elements of other colors, such as blue light-emitting elements and red light-emitting elements.

Figure 8:
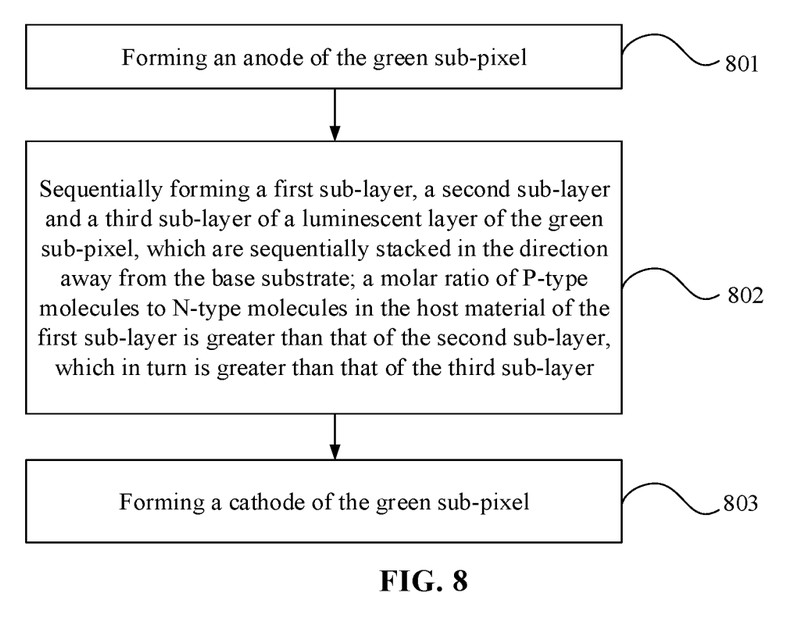
FIG. 8 shows a flowchart illustrating a method of manufacturing a display substrate according to an embodiment of the present disclosure.

FIG. 8 shows a flowchart of a method of manufacturing a display substrate according to an embodiment of the present disclosure. Based on the above structure of the display substrate, the present embodiment further provides a method for manufacturing the display substrate, including the following steps: forming a plurality of sub-pixels of different colors on a base substrate; forming the sub-pixels includes forming a green sub-pixel. Forming the green sub-pixel includes forming an anode, a luminescent layer, and a cathode sequentially stacked in a direction away from the base substrate. Forming the luminescent layer includes forming a first sub-layer, a second sub-layer and a third sub-layer sequentially stacked in the direction away from the base substrate, wherein molar ratios of P-type molecules to N-type molecules in the host materials of the first sub-layer, the second sub-layer, and the third sub-layer sequentially decrease.

Specifically, in the embodiment of the present disclosure, as shown in FIG. 8, the method for manufacturing a display substrate includes the steps of:

Step 801: forming an anode of a green sub-pixel;

Step 802: sequentially forming a first sub-layer, a second sub-layer and a third sub-layer of the green sub-pixel, wherein the first sub-layer, the second sub-layer and the third sub-layer are sequentially stacked in a direction away from a base substrate, and molar ratios of P-type molecules to N-type molecules in the host materials of the first sub-layer, the second sub-layer, and the third sub-layer sequentially decrease;

Step 803: forming a cathode of the green sub-pixel.

In this embodiment, the sequentially forming the first sub-layer, the second sub-layer and the third sub-layer includes sequentially forming the first sub-layer, the second sub-layer and the third sub-layer through an evaporation process.

In this embodiment, the anode, the cathode, and the sub-layers (i.e., the first sub-layer, the second sub-layer, and the third sub-layer) of the luminescent layer are formed through conventional processes. For example, the anode may be formed through a patterning process, the cathode may be formed through an evaporation process or a patterning process, and the sub-layers of the luminescent layer may be formed through an evaporation process. In the evaporation process for the sub-layers of the luminescent layer, a metal mask (such as a Fine Metal Mask (FMM)) is not required to be additionally used, which reduces the manufacturing cost.

In an embodiment of the present disclosure, the method for manufacturing a display substrate further includes: forming a hole transport layer and an electron transport layer, wherein the hole transport layer is located on a side of the first sub-layer close to the anode; the electron transport layer is located on a side of the third sub-layer close to the cathode.

In an embodiment of the present disclosure, the method for manufacturing a display substrate further includes: forming a hole injection layer and an electron injection layer, wherein the hole injection layer is located on a side of the hole transport layer close to the anode; the electron injection layer is located on a side of the electron transport layer close to the cathode.

In other embodiments of the present disclosure, the forming the hole transport layer includes forming a first hole transport sub-layer and a second hole transport sub-layer, wherein the first hole transport sub-layer and the second hole transport sub-layer are sequentially stacked in the direction away from the base substrate.

In other embodiments of the present disclosure, the forming the electron transport layer includes forming a first electron transport sub-layer and a second electron transport sub-layer, wherein the first electron transport sub-layer and the second electron transport sub-layer are sequentially stacked in the direction away from the base substrate.

In the display substrate provided in this embodiment, molar ratios of P-type molecules to N-type molecules in the host materials of the first sub-layer, the second sub-layer, and the third sub-layer sequentially decrease. When the temperature increases, it is possible to improve hole mobility, suppress the motion of the exciton recombination region towards the hole transport layer, thereby reducing the extent of decrease in efficiency of the green light-emitting element. When the temperature decreases, it is possible to reduce hole mobility, suppress the motion of the exciton recombination region towards the electron transport layer, thereby reducing the tendency of the exciton recombination region to be increased in size, and reducing the extent of increase in efficiency of the green light-emitting element. The display substrate manufactured by the manufacturing method provided by the embodiment generally mitigates the problem of color deviation caused by an increase in efficiency of the green light-emitting element at low temperatures and a decrease in efficiency of the green light-emitting element at high temperatures, thereby mitigating the problem that the display substrate emits light which is a little greener at low temperatures and a little redder at high temperatures during the display, and further mitigating the problem that the OLED screen emits light which is a little greener at low temperatures and a little redder at high temperatures.

The embodiment of the present disclosure also provides a display panel including the display substrate in the above embodiment or manufactured by the manufacturing method in the above embodiment.

The display substrate in the embodiment may mitigate the problem of color deviation caused by a significant change in efficiency of the display panel with the change of the temperature during the display, thereby mitigating the problem that the display panel emits light which is a little greener at low temperatures and a little redder at high temperatures during the display, and improving the display effect of the display panel.

The display panel provided by the embodiment of the present disclosure may be any product or component with a display function, such as an OLED panel, an OLED television, a display, a mobile phone, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising a base substrate and a plurality of sub-pixels of different colors on the base substrate, wherein
   the plurality of sub-pixels comprise green sub-pixels, each of which comprises an anode, a luminescent layer, and a cathode,
   the anode, the luminescent layer and the cathode are sequentially stacked in a direction away from the base substrate, and
   the luminescent layer of only the green sub-pixel comprises a first sub-layer, a second sub-layer and a third sub-layer sequentially stacked in the direction away from the base substrate, and a molar ratio of P-type molecules to N-type molecules in a host material of the first sub-layer is greater than that of the second sub-layer, which in turn is greater than that of the third sub-layer.

2. The display substrate of claim 1, wherein
   the molar ratio of P-type molecules to N-type molecules in the host material of the first sub-layer is greater than 1 and less than 9.

3. The display substrate of claim 1, wherein
   the molar ratio of P-type molecules to N-type molecules in the host material of the third sub-layer is greater than 1/9 and less than 1.

4. The display substrate of claim 1, wherein
   the molar ratio of P-type molecules to N-type molecules in the host material of the second sub-layer is greater than 1/2 and less than 2.

5. The display substrate of claim 1, wherein
   the first sub-layer has a thickness in a range 10 nm to 15 nm;
   the second sub-layer has a thickness in a range 10 nm to 15 nm; and
   the third sub-layer has a thickness in a range 10 nm to 15 nm.

6. The display substrate of claim 1, wherein
guest materials in the first sub-layer, the second sub-layer and the third sub-layer have a same doping proportion.

7. The display substrate of claim 1, wherein
the doping proportion of the guest material in the first sub-layer is in a range from 5 wt % to 10 wt %;
the doping proportion of the guest material in the second sub-layer is in a range from 5 wt % to 10 wt %; and
the doping proportion of the guest material in the third sub-layer is in a range from 5 wt % to 10 wt %.

8. The display substrate of claim 1, wherein
the green sub-pixel further comprises a hole transport layer on a side of the first sub-layer close to the anode, and an electron transport layer on a side of the third sub-layer close to the cathode.

9. The display substrate of claim 8, wherein
the hole transport layer comprises a first hole transport sub-layer and a second hole transport sub-layer sequentially stacked in the direction away from the base substrate, and the second hole transport sub-layer has a highest occupied molecular orbital energy level between a highest occupied molecular orbital energy level of the first hole transport sub-layer and a highest occupied molecular orbital energy level of the luminescent layer; and
the electron transport layer comprises a first electron transport sub-layer and a second electron transport sub-layer sequentially stacked in the direction away from the base substrate, and the first electron transport sub-layer has a lowest unoccupied molecular orbital energy level between a lowest unoccupied molecular orbital energy level of the second electron transport sub-layer and a lowest unoccupied molecular orbital energy level of the luminescent layer.

10. The display substrate of claim 8, wherein
the green sub-pixel further comprises a hole injection layer on a side of the hole transport layer close to the anode and an electron injection layer on a side of the electron transport layer close to the cathode.

11. The display substrate of claim 1, wherein
the plurality of sub-pixels further comprises red sub-pixels and blue sub-pixels, and
the red sub-pixels, the blue sub-pixels, and the green sub-pixels are arranged in an array.

12. A display panel, comprising the display substrate of claim 1.

13. A method for manufacturing the display substrate of claim 1, comprising:
forming the plurality of sub-pixels of different colors on the base substrate, wherein
the forming the plurality of sub-pixels comprises forming green sub-pixels, each of which comprises the anode, the luminescent layer, and the cathode which are sequentially stacked in the direction away from the base substrate, and
the forming the luminescent layer of only the green sub-pixel comprises sequentially forming the first sub-layer, the second sub-layer and the third sub-layer which are sequentially stacked in the direction away from the base substrate such that the molar ratio of P-type molecules to N-type molecules in the host material of the first sub-layer is greater than that of the second sub-layer, which in turn is greater than that of the third sub-layer.

14. The method for manufacturing a display substrate of claim 13, wherein
the sequentially forming the first sub-layer, the second sub-layer, and the third sub-layer comprises sequentially forming the first sub-layer, the second sub-layer, and the third sub-layer through an evaporation process.

15. The display substrate of claim 2, wherein
the molar ratio of P-type molecules to N-type molecules in the host material of the third sub-layer is greater than 1/9 and less than 1.

16. The display substrate of claim 2, wherein
the molar ratio of P-type molecules to N-type molecules in the host material of the second sub-layer is greater than 1/2 and less than 2.

17. The display substrate of claim 2, wherein
the first sub-layer has a thickness in a range 10 nm to 15 nm;
the second sub-layer has a thickness in a range 10 nm to 15 nm; and
the third sub-layer has a thickness in a range 10 nm to 15 nm.

18. The display substrate of claim 2, wherein
guest materials in the first sub-layer, the second sub-layer and the third sub-layer have a same doping proportion.

19. The display substrate of claim 2, wherein
the doping proportion of the guest material in the first sub-layer is in a range from 5 wt % to 10 wt %;
the doping proportion of the guest material in the second sub-layer is in a range from 5 wt % to 10 wt %; and
the doping proportion of the guest material in the third sub-layer is in a range from 5 wt % to 10 wt %.

20. The display substrate of claim 2, wherein
the green sub-pixel further comprises a hole transport layer on a side of the first sub-layer close to the anode, and an electron transport layer on a side of the third sub-layer close to the cathode.

* * * * *